United States Patent [19]

Ramsey, Jr.

[11] 4,424,484

[45] Jan. 3, 1984

[54] INDUCTION METER HAVING AN IMPROVED ELECTROMAGNETIC VOLTAGE SECTION

[75] Inventor: James E. Ramsey, Jr., Raleigh, N.C.

[73] Assignee: Westinghouse Electric Corp., Pittsburgh, Pa.

[21] Appl. No.: 272,245

[22] Filed: Jun. 10, 1981

[51] Int. Cl.³ .......................................... G01R 11/02
[52] U.S. Cl. .................................................. 324/137
[58] Field of Search ................ 324/136, 137, 138, 139

[56] References Cited

U.S. PATENT DOCUMENTS

| 2,352,965 | 7/1944 | Mendelsohn ........................ 324/137 |
| 3,493,862 | 2/1970 | Ramsey, Jr. et al. ............... 324/137 |
| 4,213,090 | 7/1980 | Keever et al. ..................... 324/138 |

FOREIGN PATENT DOCUMENTS

| 867571 | 2/1953 | Fed. Rep. of Germany . |
| 2356132 | 5/1975 | Fed. Rep. of Germany . |
| 483022 | 12/1969 | Switzerland . |
| 582561 | 11/1946 | United Kingdom . |

Primary Examiner—Gerard R. Strecker
Assistant Examiner—Warren S. Edmonds

[57] ABSTRACT

An induction meter has an improved voltage magnetic section comprised of a substantially E-shaped laminated magnetic core having a center leg and two adjacent legs. A nonmagnetic multi-function support and spacer bracket extending from one of the adjacent legs to the other adjacent leg has three perpendicular extensions which give the bracket a substantially E-shaped configuration and which each are riveted to one of the legs of the magnetic core. The perpendicular extension riveted to the center leg provides support for the voltage coil. A light load adjuster bracket provides an adjustable shunt path for magnetic flux between the main pole face and the auxiliary pole faces. The light load adjuster bracket is located in magnetic proximity to the first side of the magnetic core and is separated therefrom by the nonmagnetic bracket.

4 Claims, 3 Drawing Figures

U.S. Patent  Jan. 3, 1984  4,424,484
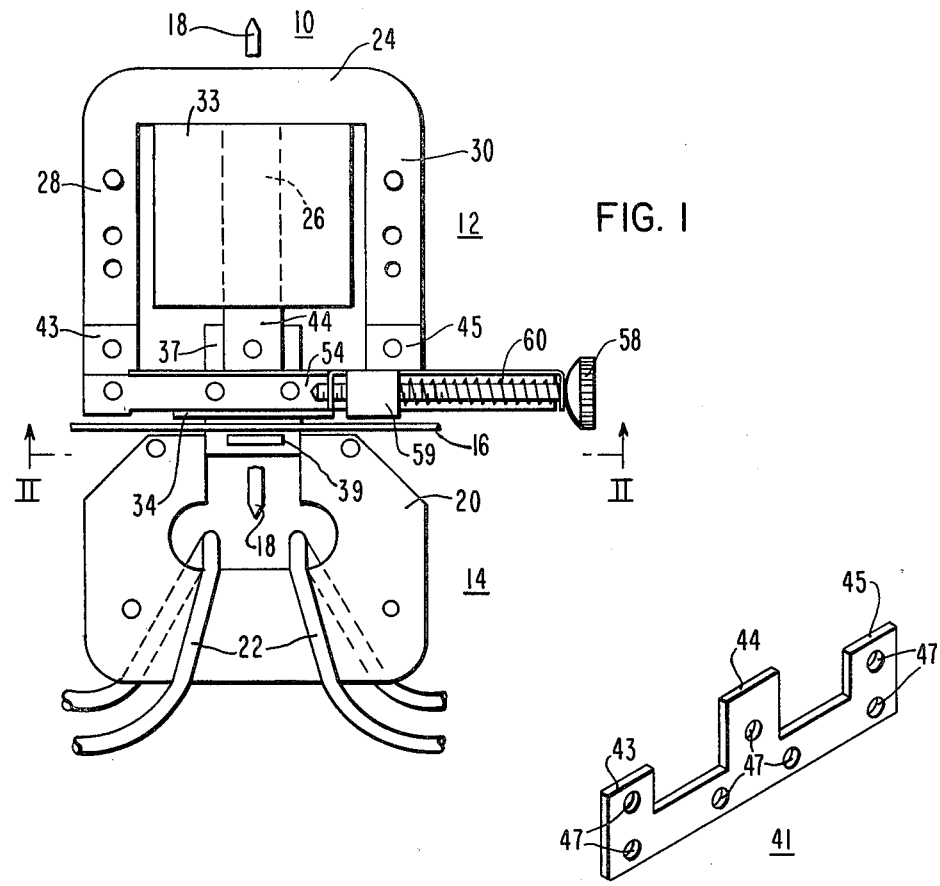
FIG. 1
FIG. 3
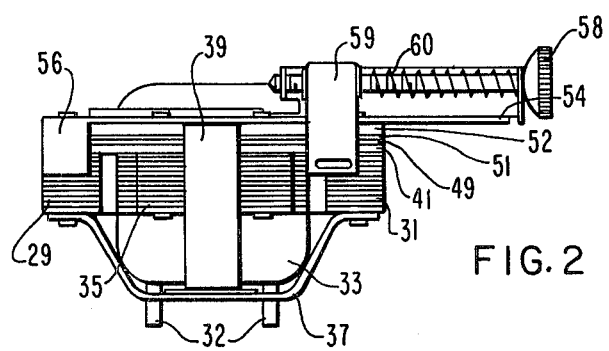
FIG. 2

INDUCTION METER HAVING AN IMPROVED ELECTROMAGNETIC VOLTAGE SECTION

BACKGROUND OF THE INVENTION

1. Field of the Invention

This invention relates generally to induction meters having an electromagnetic assembly comprised of a voltage section and a current section, and more particularly, to the voltage section of such meters.

2. Description of the Prior Art

Induction meters such as watthour meters are almost universally used for billing and load monitoring of AC electric energy generated and transmitted by an electric utility to a residential or a commercial electric energy consumer. A watthour meter has an electromagnetic assembly comprised of a voltage magnetic section and a current magnetic section. The voltage magnetic section is comprised of a laminated E-shaped magnetic core having a voltage winding on the center leg. Various fixed and adjustable magnetic flux shunting paths are provided so that the magnetic voltage section produces magnetic flux representative of the voltage component of an AC energy quantity consumed.

The current magnetic section is comprised of a laminated C-shaped magnetic core having a coil wound thereon responsive to the current component of the AC energy quantity consumed. The current magnetic section produces magnetic flux representative of the current component.

The voltage magnetic section and the current magnetic section are mounted so as to provide a predetermined gap therebetween in which an electroconductive disk rotates. The magnetic flux produced by the voltage and current magnetic sections interact with eddy currents in the electroconductive disk to produce a rotating torque which causes the disk to rotate at a calibrated rate. The speed of the rotating disk has a predetermined ratio to the consumed electric energy quantity as is well known in the metering art.

U.S. Pat. No. 4,213,090 illustrates a voltage magnetic section of a watthour meter having an integral flux lagging and light load adjustment assembly.

SUMMARY OF THE INVENTION

The present invention is for an induction meter having a voltage and a current magnetic sections each producing magnetic flux representative of a voltage and a current component, respectively, of an electric energy quantity to be measured. An electroconductive rotatable disk is driven at a rate responsive to the magnetic flux directed from the voltage and current magnetic sections into the disk. The voltage section is comprised of a substantially E-shaped laminated magnetic core having a center leg terminating at an expanded area defining a main pole face. The core has two adjacent legs terminating at coplanar auxiliary pole faces on opposite sides of the main pole face which act as flux return paths. A first and a second laminate define a first and a second side, respectively, of the core.

A voltage coil is wound about the center leg and receives the voltage component of the AC energy quantity to be measured. A nonmagnetic, multi-function support and spacer bracket extends from one of the adjacent legs to the other adjacent leg. The multi-function bracket has three perpendicular extensions giving the bracket a substantially E-shaped configuration. Each of the perpendicular extensions corresponds to one of the legs of the core. The multi-function bracket is oriented so as to be adjacent the first side of the core and to have one edge substantially coplanar with the auxiliary pole faces. The perpendicular extension corresponding to the center leg provides support for the voltage coil.

A light load adjuster bracket provides an adjustable shunt path for the magnetic flux between the main pole face and the auxiliary pole faces. The light load adjuster bracket is in magnetic proximity to the first side of the magnetic core with the multi-function bracket acting as a spacer therebetween. The light load adjuster bracket, the multi-function bracket and the laminae of the magnetic core have corresponding openings therethrough so as to be riveted together thereby providing a rigid structure.

The voltage section is completed by a power factor bracket which extends from the second side of the magnetic core. The power factor bracket carries a flux return tongue which is located opposite the main pole face, maintaining a spaced relationship therewith. The electroconductive disk rotates in the space between the flux return tongue and the main pole face.

BRIEF DESCRIPTION OF THE DRAWINGS

FIG. 1 is a front elevational view of an electromagnetic assembly of an induction meter including a current magnetic section and a voltage magnetic section constructed according to the present invention;

FIG. 2 is a cross sectional view of FIG. 1 taken along the axis II—II and looking in the direction of the voltage magnetic section; and FIG. 3 is a perspective view of a nonmagnetic, multi-function support and spacer bracket.

DESCRIPTION OF THE PREFERRED EMBODIMENT

Referring to FIG. 1, there is shown an electromagnetic assembly of a single phase induction watthour meter 10 for measuring the electric energy transmitted from an electric energy supplier to a customer thereof. While the following description is made in conjunction with the induction watthour meter 10, the teachings of the present invention need not be limited thereto. The present invention is equally applicable to multi-phase meters, and to induction meters capable of measuring quantities other than watthours.

The single stator electromagnetic assembly of the meter 10 includes a voltage magnetic section 12 and a current magnetic section 14 carried by a frame (not shown). An electroconductive disk 16 is carried by a shaft 18 (partially shown) for rotation in a predetermined gap between the voltage and current magnetic sections 12 and 14, respectively.

The current magnetic section 14 is comprised of a laminated C-shaped magnetic core 20 and current coils 22 formed of a large diameter conductor. The current coils 22 are connectable in a conventional manner in series with an AC line current component of an electrical energy quantity to be measured.

The voltage magnetic section 12 is comprised of an E-shaped laminated magnetic core 24 having a center leg 26, a first adjacent leg 28 terminating in a first auxiliary pole face 29 (shown in FIG. 2) and a second adjacent leg 30 terminating in a second auxiliary pole face 31 (shown in FIG. 2). The first and second adjacent legs 28 and 30, respectively, are disposed on opposite sides of the center leg 26. The first and second auxiliary pole faces 29 and 31, respectively, are coplanar. The center leg 26 cooperates with an expanded laminated magnetic pole piece having a first and second portions. The pole piece is oriented such that the first portion (not visible) is substantially colinear with the center leg 26 and the second portion 34 is substantially perpendicular to the center leg 26, with the second portion 34 terminating in a main pole face 35 (shown in FIG. 2). The center leg 26 carries a voltage coil 33 enclosed within a protective encapsulating material and having terminals 32 (shown in FIG. 2) connectable in a conventional manner so as to receive an AC line voltage component of the electric energy quantity to be measured.

When the voltage coil 33 and the current coils 22 are properly energized from the AC line voltage and current components, respectively, of the AC electric energy quantity to be measured, the main pole face 35 of the E-shaped magnetic core 24 and one of the pole faces of the C-shaped magnetic core 20 become sources of magnetic flux. A working voltage flux component and a working current flux component flow from the respective pole faces into the airgap and into the disk 16. The working airgap voltage and current fluxes produce eddy currents in the disk 16 which develop a resultant torque acting to drive the disk 16 and the shaft 18. The torque on the disk 16 produces a rate of rotation of speed that is dependent upon the product of the AC line voltage and current components and the phase angle therebetween. The rotation of the disk 16 and shaft 18 may be employed in a suitable manner for indicating the measured electric energy such as by a dial register (not shown) connected to the shaft 18. Such measurement is well known and does not form an important feature of the present invention.

Turning now to a more detailed description of the voltage magnetic section 12, the first and last laminae of the magnetic core 24 define a first and a second side, respectively. FIG. 1 is a view of the first side of the magnetic core 24. The second side of the magnetic core 24 has a power factor bracket 37 extending therefrom. The power factor bracket 37 carries a flux return tongue 39 which is best viewed in FIG. 2. The flux return tongue 39 is located opposite the main pole face 35 with a predetermined spaced relationship therebetween. The electroconductive disk 16 (not shown in FIG. 2) rotates in the predetermined space. The power factor bracket 37 and the flux return tongue 39 provide a magnetic flux path for returning voltage magnetic flux to the core 24.

In FIG. 2, the components adjacent to the first side of the voltage core 24 are shown. A nonmagnetic, multifunction support and spacer bracket 41 extends from the first adjacent leg 28 to the second adjacent leg 30. The bracket 41 is oriented so as to have one edge substantially coplanar with the auxiliary pole faces 29 and 31. The bracket 41 has three perpendicular extensions 43, 44 and 45 giving the bracket 41 an E-shape as shown in FIG. 3. The first perpendicular extension 43 corresponds to the first adjacent leg 28; the second and third perpendicular extensions 44 and 45 correspond to the center leg 26 and the second adjacent leg 30, respectively. The bracket 41 has a plurality of openings 47 therethrough which correspond to openings in the laminae of the voltage magnetic core 24. These openings are typically used for riveting thereby providing a rigid assembly. The second perpendicular extension 44 provides support for the voltage coil 33. The bracket 41 additionally acts as a nonmagnetic spacer between the first side of the voltage core 24 and a voltage shunting member 49.

The voltage shunting member 49 is located in magnetic proximity with the main pole face 35, the first auxiliary pole face 29 and the second auxiliary pole face 31 thereby providing a magnetic flux shunt path for a predetermined amount of magnetic flux depending upon the thickness of the bracket 41. In summary, the bracket 41 provides a variety of functions. First, the bracket is used as a nonmagnetic spacer between the voltage shunting member 49 and the first side of the voltage core 24. Second, the second perpendicular extension 44 of the bracket 41 serves to position and hold the voltage coil 33. Finally, the bracket 41 is an integral part of the magnetic voltage section 12 thereby allowing the voltage section 12 to be riveted together so as to provide a rigid structure.

Completing the description of FIG. 2, a first nonmagnetic spacer 51 and a second nonmagnetic spacer 52 provide a predetermined space between the voltage shunting member 49 and a fixed light load adjuster bracket 54. The fixed light load adjuster bracket 54 is located in magnetic proximity to the first side of the voltage core 24. The bracket 54 has a fixed tab 56 extending over a portion of the first auxiliary pole face 29. The bracket 54 carries a screw 58 having threads cooperating with threads of a movable tab or slider 59. A spring 60 is located between the movable tab 59 and a portion of the bracket 54. The position of the movable tab 59 be adjusted by turning the screw 58 such that the movable tab 59 extends over adjustable portions of the main pole face 35 and the second auxiliary pole face 31. The movable tab 59 provides an adjustable shunt path for magnetic flux between the aforementioned pole faces. Additionally, the light load adjuster bracket 54 together with the fixed tab 56 and the movable tab 59 provide an additional magnetic flux shunt path. A more detailed description of the fixed light load adjuster bracket 54 is provided in copending U.S. patent application Ser. No. 272,243 (W. E. Case No. 49,166). The bracket 54, the first nonmagnetic spacer 51, the second nonmagnetic spacer 52 and the power factor bracket 37 all have openings therethrough corresponding to the openings 47 of the bracket 41 so that the entire voltage magnetic section 12 may be riveted together thereby providing a low cost, structurally efficient and reliable voltage section.

What I claim is:

1. An induction meter including a voltage magnetic section and a current magnetic section each producing magnetic flux and a rotatable disk driven at a rate responsive to said magnetic flux directed from said magnetic sections into said disk, wherein said voltage magnetic section comprises:

a substantially E-shaped laminated magnetic core having a center leg terminating at a main pole face and two adjacent legs terminating at coplanar auxiliary pole faces on opposite sides of said main pole face, said first and last laminae defining first and second sides, respectively, of said core;

a voltage coil wound about said center leg;

a nonmagnetic member supported by said core and extending from one of said adjacent legs to said other adjacent leg, said member having three perpendicular extensions with each extension corresponding to one of said legs, said member being oriented so as to be adjacent said first side and having one edge substantially coplanar with said auxiliary pole faces, said extension corresponding to said center leg providing support for said voltage coil;

means supported by said core for providing an adjustable shunt path for magnetic flux between said main pole face and said auxiliary pole faces, said means located in magnetic proximity to said first side and separated therefrom by said nonmagnetic member;

a power factor bracket extending from said second side of said magnetic core; and a flux return tongue carried by said power factor bracket and located opposite said main pole face and maintaining a spaced relationship therewith, said disk rotating in said space.

2. The meter of claim 1 wherein the core includes a T-shaped laminated magnetic pole piece having a first and a second member, said first member being connected to said center leg and substantially colinear therewith, and said second member being substantially perpendicular to center leg and forming the main pole face.

3. The meter of claim 1 wherein the nonmagnetic member, the power factor bracket and the laminae of the magnetic core have corresponding openings therethrough receiving rivets thereby providing a solid assembly.

4. The meter of claim 1 including a voltage shunting member supported by said core adjacent the nonmagnetic member whereby said nonmagnetic member acts as a spacer between said voltage shunting member and said core and including a spacing member adjacent said voltage shunting member separating the means for providing the adjustable shunt paths from said voltage shunting member.

* * * * *